US011648789B2

(12) United States Patent
Clayton et al.

(10) Patent No.: US 11,648,789 B2
(45) Date of Patent: May 16, 2023

(54) LASER CONTAINMENT STRUCTURE FOR A LASER PRINTHEAD

(71) Applicant: ZEBRA TECHNOLOGIES CORPORATION, Lincolnshire, IL (US)

(72) Inventors: Richard Mark Clayton, Manorville, NY (US); Patrick Martin Brown, North Medford, NY (US); Chinmay Nanda, Port Jefferson Station, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 268 days.

(21) Appl. No.: 16/855,693

(22) Filed: Apr. 22, 2020

(65) Prior Publication Data

US 2021/0331275 A1 Oct. 28, 2021

(51) Int. Cl.

| | | |
|---|---|---|
| B41J 2/44 | (2006.01) | |
| B41J 2/47 | (2006.01) | |
| B41J 2/475 | (2006.01) | |
| B41J 3/407 | (2006.01) | |
| B41J 29/02 | (2006.01) | |
| B41J 29/40 | (2006.01) | |
| B41J 29/54 | (2006.01) | |
| B41M 5/30 | (2006.01) | |
| B23K 26/351 | (2014.01) | |
| B23K 26/04 | (2014.01) | |
| G03F 7/20 | (2006.01) | |

(52) U.S. Cl.
CPC .............. *B41J 29/54* (2013.01); *B23K 26/048* (2013.01); *B23K 26/351* (2015.10); *B41J 2/442* (2013.01); *B41J 2/47* (2013.01); *B41J 3/407* (2013.01); *B41J 29/02* (2013.01); *B41J 29/40* (2013.01); *B41M 5/305* (2013.01); *B41J 2002/4756* (2013.01); *G03F 7/70025* (2013.01)

(58) Field of Classification Search
CPC ....... B41J 2/44; B41J 2/442; B41J 2/47; B41J 2/475; B41J 2/4753; B41J 2002/4756; B41J 3/407; B41J 29/02; B41J 29/40; B41J 29/54
See application file for complete search history.

(56) References Cited

U.S. PATENT DOCUMENTS

| | | | | |
|---|---|---|---|---|
| 7,853,353 | B1 * | 12/2010 | Hagen ..................... | G07F 17/26 700/235 |
| 11,064,086 | B1 * | 7/2021 | Brown ............... | H04N 1/00997 |
| 2013/0314488 | A1 * | 11/2013 | Bier ......................... | B41J 3/407 347/263 |
| 2017/0001459 | A1 * | 1/2017 | Uehira ................. | B41M 7/0009 |

\* cited by examiner

*Primary Examiner* — Christopher E Mahoney
*Assistant Examiner* — Kendrick X Liu

(57) ABSTRACT

A laser printhead assembly for a laser printhead is disclosed herein. The laser printhead assembly may include a laser containment door; and a laser containment housing that is configured to form a sealed enclosure with a label support of a rewriteable label. The sealed enclosure may be configured to include the rewriteable label and the laser printhead. The laser containment door, in a laser-enabled position, may be configured to permit the laser printhead, via a light beam, to modify the rewriteable label and the laser containment door, in a laser-disabled position, may be configured to prevent a light beam from escaping the laser containment housing.

19 Claims, 9 Drawing Sheets

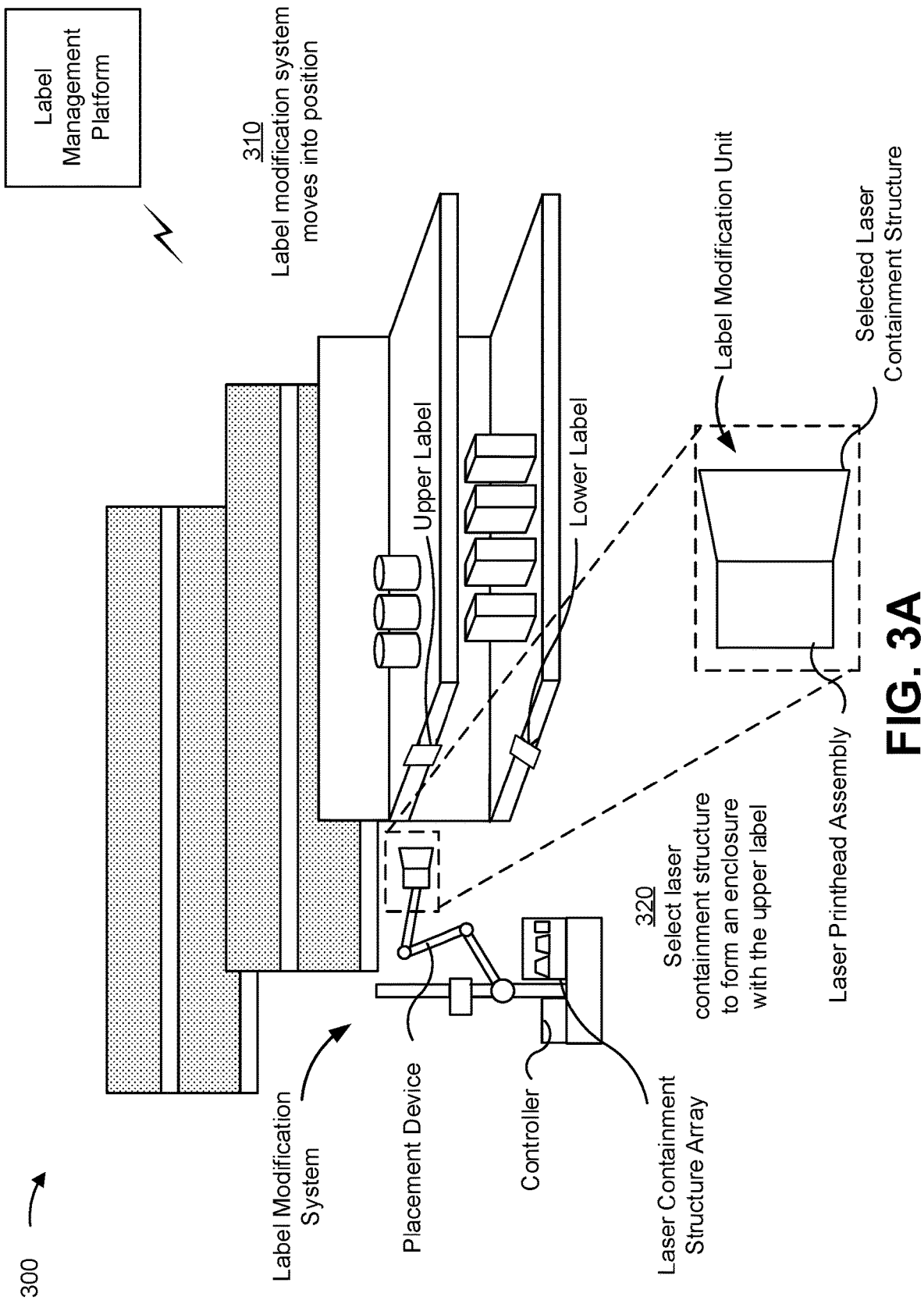

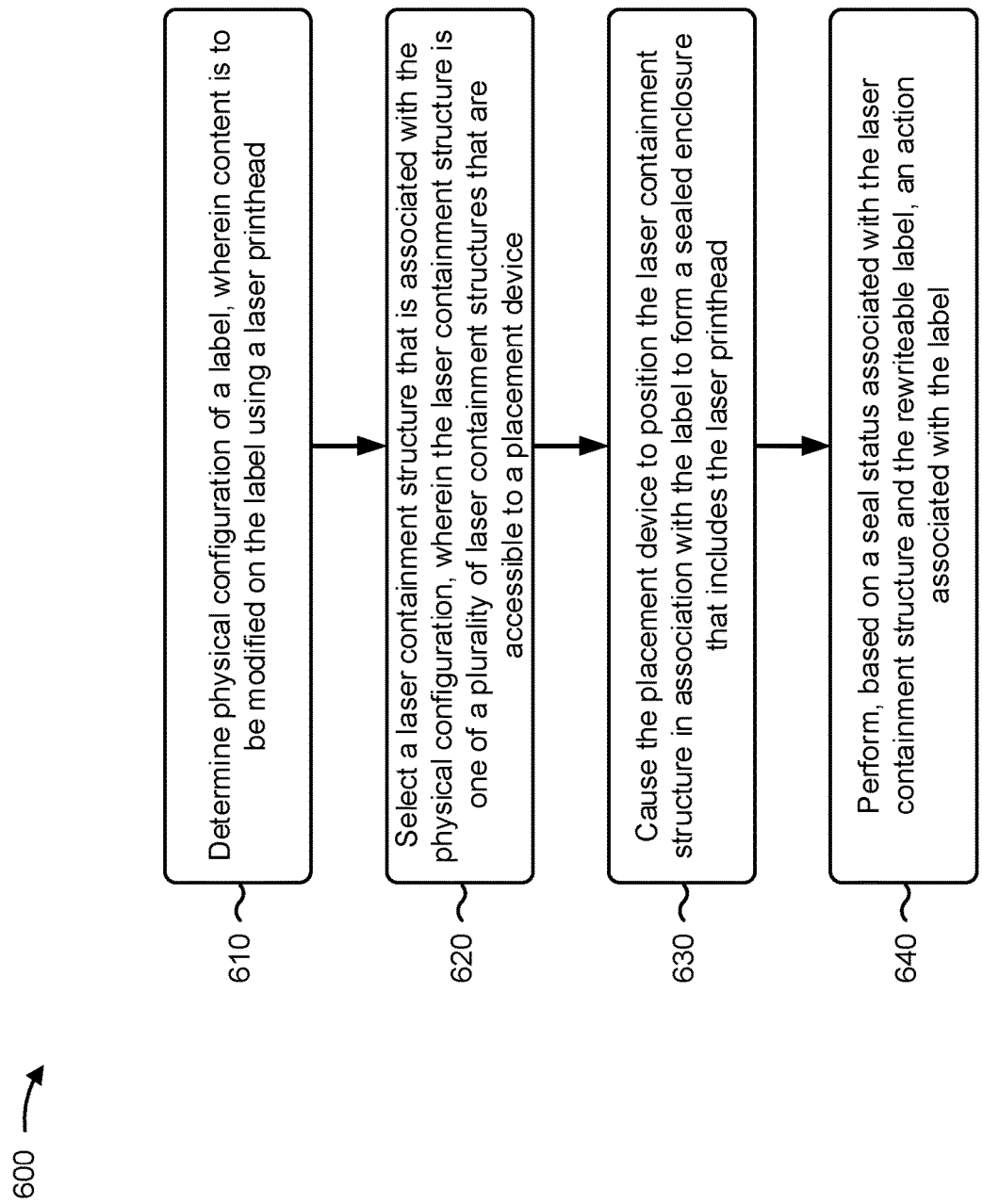

LASER CONTAINMENT STRUCTURE FOR A LASER PRINTHEAD

BACKGROUND

Laser printing involves the production of text and graphics by passing a light beam over a material, such as a rewriteable label. A laser printhead can be configured to write or erase content from the material based on photothermal properties of the material. The laser printhead may be configured to emit the light beam at a certain power level, with a certain a spot size, and/or the like. The light beams, during a write operation and/or erase operation, can cause a temperature of the material to reach and/or exceed 100 degrees Celsius (C.°). Accordingly, using a laser can inadvertently cause damage to materials if the light beam is not contained within a structure. Furthermore, irradiation from the light beams can be harmful in certain situations. Therefore, there is a need to provide systems, devices, and/or methods to contain the light beam within a structure when performing a write operation and/or erase operation to avoid inadvertent exposure to certain objects, materials, and/or humans.

SUMMARY

According to some implementations, a laser printhead assembly for a laser printhead may include a laser containment door; and a laser containment housing that is configured to form a sealed enclosure with a label support of a rewriteable label, wherein the sealed enclosure is configured to include the rewriteable label and the laser printhead, wherein the laser containment door, in a laser-enabled position, is configured to permit the laser printhead, via a light beam, to modify the rewriteable label, and wherein the laser containment door, in a laser-disabled position, is configured to prevent a light beam from escaping the laser containment housing.

According to some implementations, a label modification unit may include a laser printhead assembly that is configured to modify, via a light beam, a rewriteable label that is mounted to a label support; and a laser containment housing that includes a label-side end that includes an opening, wherein the opening is configured to match a label support fitting of the label support; a laser-side end that is opposite the label-side end, wherein the laser printhead assembly is positioned at the laser-side end; and a laser containment door that is between the laser-side end and the label-side end, wherein, based on whether a sealed enclosure is formed between the laser containment housing and a label support fitting of the rewriteable label, the laser containment door is configured to: enable the light beam to pass through the opening to modify the rewriteable label when a sealed enclosure is formed, or prevent the light beam from escaping the laser containment housing when a sealed enclosure is not formed.

According to some implementations, a label modification system may include a placement device and a label modification unit, movable by the placement device, that includes a laser printhead assembly; a laser containment structure that includes an opening at a label-side end of the label modification unit, wherein the opening is configured to be aligned, by the placement device, with a label support fitting associated with a rewriteable label; and a laser containment door that is between the laser containment structure and the laser printhead assembly, wherein the laser containment door is configured to maintain a laser printhead of the laser printhead assembly within a sealed enclosure.

According to some implementations, a method may include determining a physical configuration of a rewriteable label, wherein content can be modified on the rewriteable label using a laser printhead, and wherein the rewriteable label is supported by a label support fitting; selecting a laser containment structure that is associated with the physical configuration, wherein the laser containment structure is one of a plurality of laser containment structures that are accessible to a placement device; causing the placement device to position the laser containment structure to form a sealed enclosure that includes the rewriteable label and the laser printhead; obtaining, from a sensor associated with the sealed enclosure, seal information associated with coupling the laser containment structure and a label support fitting of the rewriteable label; determining, based on the seal information, a coupling status associated with the laser containment structure and the label support fitting; and performing, based on the coupling status, an action associated with the rewriteable label.

According to some implementations, a label modification system may include a placement device; a laser printhead assembly that includes a laser printhead; and a controller configured to: determine a physical configuration of a rewriteable label, wherein content can be modified on the rewriteable label using the laser printhead; select a laser containment structure that is associated with the physical configuration, wherein the laser containment structure is one of a plurality of laser containment structures that are accessible to a placement device; cause the placement device to position the laser containment structure in association with a label support fitting of the rewriteable label; verify that a sealed enclosure, that includes the rewriteable label and the laser printhead, is formed by the containment structure and the label support fitting; and perform an action associated with the laser printhead modifying content on the rewriteable label.

According to some implementations, a device may include a memory and a processor, communicatively coupled to the memory, configured to: determine a physical configuration of a rewriteable label, wherein content modifiable on the rewriteable label using a laser printhead; select a laser containment structure that is associated with the physical configuration, wherein the laser containment structure is one of a plurality of laser containment structures that are accessible to a placement device; cause the placement device to position the laser containment structure in association with the rewriteable label to form a sealed enclosure that includes the laser printhead; and perform, based on a seal status associated with the laser containment structure and the rewriteable label, an action associated with the rewriteable label.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate implementations of concepts disclosed herein and explain various principles and advantages of those implementations.

FIGS. 3A-3D illustrate one or more example implementations associated with using and/or controlling a label modification unit described herein.

FIG. 6 illustrates a flowchart of an example process for configuring a sealed enclosure for a laser printhead.

Figure 1:
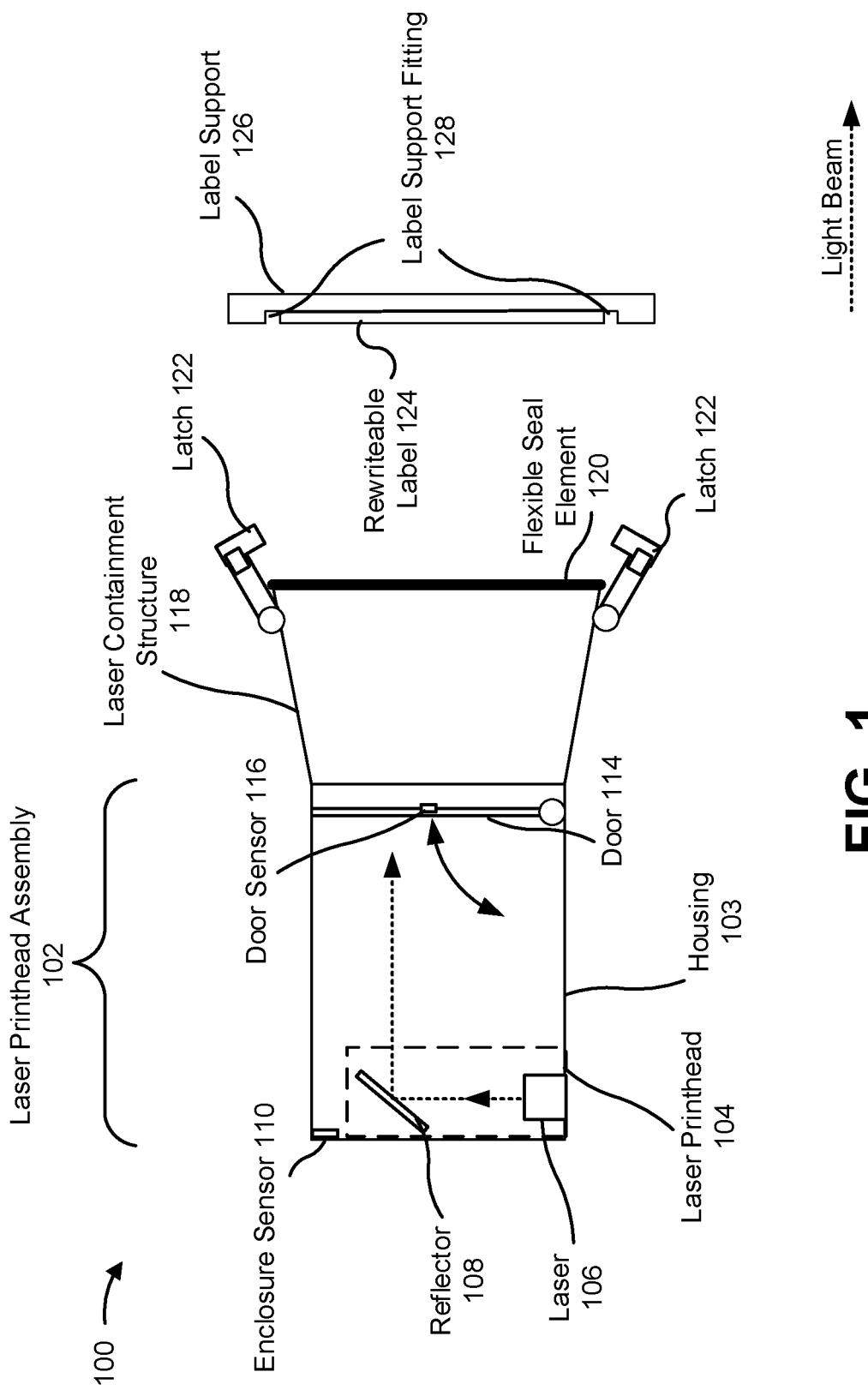
FIG. 1 illustrates an example implementation of a label modification unit described herein

Skilled artisans will appreciate that elements in the figures are illustrated for simplicity and clarity and have not necessarily been drawn to scale. For example, the dimensions of some of the elements in the figures may be exaggerated relative to other elements to help to improve understanding of implementations described herein.

The apparatus and method elements have been represented where appropriate by conventional symbols in the drawings, showing only those specific details that are pertinent to understanding the implementations described herein so as not to obscure the disclosure with details that will be readily apparent to those of ordinary skill in the art having the benefit of the description herein.

DETAILED DESCRIPTION

The following detailed description of example implementations refers to the accompanying drawings. The same reference numbers in different drawings may identify the same or similar elements.

A laser printhead of a laser printer can be configured to write or erase content when used in combination with rewriteable media, such as a rewriteable label. According to certain standards and/or configurations, the laser printhead is configured to be contained within an enclosure (e.g., a housing of the laser printer) to prevent the light beam from inadvertently reaching areas of an environment of the rewriteable label (e.g., to prevent the light beam from overheating certain objects within the environment). In some cases, such laser printers are configured to be stationary and/or within fixed positions. However, in some cases, a laser printhead may be utilized within a mobile and/or navigable device (e.g., an autonomously controlled device) that is configured to modify one or more rewriteable labels within the environment.

Some implementations described herein provide a label modification unit that includes one or more components and/or structures that are configured to maintain a laser printhead within a sealed enclosure when writing content to or erasing content from a rewriteable label. As described herein, the label modification unit may be configured to form an enclosure with the rewriteable label and/or a support of the rewriteable label. Additionally, or alternatively, the label modification unit may include a laser containment system to maintain the laser printhead within an enclosure when the label modification unit is being moved between rewriteable labels. Moreover, the label modification system may include an array of different laser containment structures to permit a single laser printhead assembly to form a sealed enclosure with a plurality of rewriteable labels that have different physical configurations.

In this way, the label modification system described here can ensure that a portable label modification unit abides by standards associated with preventing the light beam from inadvertently escaping an enclosure of the label modification unit (e.g., an enclosure formed from a housing, a laser containment structure, and/or a rewriteable label) and/or reaching an environment surrounding the label modification unit (and correspondingly preventing damage to objects in the environment). Moreover, the label modification system may permit a variety of different rewriteable labels, to be modified by a same label modification unit, thus enhancing efficiencies associated with the label modification system (e.g., by preventing a need to reroute for maintenance or replacement of a printhead that does not fit a particular rewriteable label, by reducing a quantity of printheads and/or label modification systems required to adjust different rewriteable labels within an environment, and/or the like).

FIG. 1 is a diagram of an example implementation of a label modification unit 100 described herein. As shown in the example of FIG. 1, the label modification unit 100 includes a laser printhead assembly 102 that includes a housing 103 that supports a laser printhead 104 with a laser 106 and a reflector 108.

The label modification unit 100 includes a laser containment structure 118 that includes a flexible seal element 120 that is configured in association with an opening (e.g., positioned or situated on at least a portion of an edge of the opening) of the laser containment structure 118. The laser containment structure 118 may be referred to herein as being situated toward a "label-side end" of the label modification unit 100 and the laser printhead may be referred to herein as being situated toward a "laser-side end" of the label modification unit 100. The laser-side end of the label modification unit 100 may be opposite the label-side end. Additionally, or alternatively, the label-side end may include an opening in the housing 103 while the laser-side end may not include an opening in the housing 103. The opening may be associated with a light beam passageway that extends from a laser of the laser printhead assembly, through the laser containment structure 118, and to the opening and/or the rewriteable label. In some implementations, the laser containment structure 118 and/or flexible seal element 120 may be formed as part of the housing 103 (e.g., as a single component). In such a case, a combination of the laser containment structure 118 and the housing 103 may be referred to herein as a "laser containment housing."

According to some implementations described herein, the label modification unit 100 is configured to form a sealed enclosure with a rewriteable label 124 and/or a label support 126 that includes a label support fitting 128. As shown in FIG. 1, the laser printhead assembly 102 includes components (e.g., the laser printhead 104, the enclosure sensor 110, the door 114, the door sensor 116, and/or the like) to generate and control a light beam to modify the rewriteable label 124.

The laser printhead 104 includes various components to produce and/or control a light beam. For example, the laser 106 of the laser printhead 104 may include a light emitter (e.g., a laser to produce a light beam) and one or more optical elements (e.g., a collimator, a lens, and/or the like to control a spot size of a light beam). Using these components, the laser 106 may emit a light beam (e.g., that is focused into a laser beam) at a particular power level to write or erase content from the rewriteable label 124. Furthermore, the reflector 108 of the laser printhead 104 includes a material made of a reflective material to redirect a light beam. For example, the reflector 108 may include one or more mirrors (e.g., one or more galvanic mirrors) configured to reflect a light beam at a particular angle or toward a particular direction. In some implementations, the reflector 108 may be able to move, such that the reflector 108 may be used to dynamically redirect the light beam emitted by the laser 106. The dynamic nature of the reflector 108 may assist directing the light beam along a particular path to write and/or erase content on the rewriteable label 124. The movement of the reflector 108 may allow the reflector 108 to manipulate the light beam in place of other components (e.g., the laser 106), which may be heavier, more difficult to move, use more resources for movement, and/or the like.

The enclosure sensor 110 includes one or more sensor devices that may be used to detect whether a sealed enclosure associated with the label modification unit 100 and/or the rewriteable label 124 has been formed. The enclosure sensor 110 may include, for example, a light sensor (e.g., a photo diode, a photoresistor, a photovoltaic light sensor, and/or the like), a camera (e.g., a digital color camera, a greyscale camera, an infrared camera, an ultraviolet camera, and/or the like), a pressure sensor (e.g., a sealed pressure sensor, a vacuum pressure sensor, a gauge pressure sensor, and/or the like), and/or the like. As described herein, the enclosure sensor 110 may be used to determine a seal status that indicates whether a seal has been formed or a gap exists between two or more components of FIG. 1 to form the sealed enclosure. More specifically, the enclosure sensor 110 may provide information identifying whether a seal has been formed between the laser containment structure 118 and the rewriteable label 124, whether a seal has been formed between the laser containment structure 118 and the label support 126, whether a seal has formed between the door 114 and the housing 103, and/or the like.

The door sensor 116 includes one or more sensor devices that may be used for aligning the label modification unit 100 with the rewriteable label 124 to facilitate formation of a sealed enclosure between the laser containment structure 118 and the rewriteable label 124. For example, the door sensor 116 may include a camera (e.g., a digital color camera, a greyscale camera, an infrared camera, an ultraviolet camera, and/or the like), a scanner (e.g., an optical scanner, a barcode scanner, and/or the like), a ranging sensor (e.g., a light detection and ranging sensor (LIDAR), a radio detection and ranging sensor (radar), and/or the like), and/or the like. In some implementations, the door sensor 116 may be used to detect and/or scan a code (e.g., a linear barcode, a matrix barcode, a 3D barcode, and/or the like) that indicates information about a rewriteable label, such as a size of the rewriteable label, a shape of the rewriteable label, a dimension of the rewriteable label, a location of the rewriteable label, a containment structure associated with the rewriteable label, and/or the like. In some implementations, the door sensor 116 may be used by a placement device, as described herein, to align the label modification unit 100 with the rewriteable label 124 to permit the label modification unit 100 to modify the rewriteable label 124.

The door 114 is used to help enclose the laser printhead 104 within an enclosure (e.g., to prevent a light beam from inadvertently leaving a sealed enclosure formed by the housing 103 and the door 114). The door 114 may be configured to move between a closed position (to close a light beam passageway of the light beam) and an open position (to open the light beam passageway). As described herein, the door 114 may be operated and/or controlled in a similar manner as an airlock. For example, the door 114 may be configured to only be open (e.g., for label modification) when a sealed enclosure is formed with the rewriteable label 124 and/or label support 126. In an open position, the door 114 may be in a laser-enabled position that permits the light beam to pass through the laser containment structure 118. In a closed position (shown in FIG. 1), the door 114 may be in a laser-disabled position that prevents the light beam from passing through the laser containment structure 118.

In FIG. 1, the door 114 is a hinged door that is hinged at an internal surface or side of the housing 103 and is configured to swing toward the laser printhead 104). However, other examples are possible. For example, the door 114 may be configured to swing toward the label-side end of the housing 103 and/or be hinged on a support within the housing 103. Additionally, or alternatively, the door 114 may be a sliding door that can be slidably removed from the light beam passageway (e.g., to open the light beam passageway) or slidably placed within the light beam passageway (e.g., to close the light beam passageway). Additionally, or alternatively, the door 114 may be of various sizes and may not encompass the entire length of the laser printhead assembly 102.

The laser containment structure 118 includes a device that has two openings, where a first opening (e.g., that is toward the laser printhead assembly 102) is configured to fit onto a first device (e.g., laser printhead assembly 102), and a second opening (e.g., that is toward the rewriteable label 124) is configured to fit and/or seal onto a second device (e.g., the rewriteable label 124). The openings are aligned with a light passageway of the light beam to permit the light beam to pass through the laser containment structure 118. The laser containment structure 118 may be formed of a material (e.g., a similar material as the housing 103) that is configured to withstand the light beam, such that while the light beam may pass through the one or more openings, the light beam is unable to pass through walls of the laser containment structure 118. The laser containment structure 118 may be fit with a flexible seal element 120 to allow a seal to be formed with the second opening. The flexible seal element 120 may include a gasket, an O-ring, rubber, and/or another material that allows a seal to be formed between the laser containment structure 118 and another object abutting the laser containment structure 118.

The rewriteable label 124 may include a photothermal material of a first color, which upon a change in temperature, results in a change to a different, second color. In some implementations, other temperature applications (e.g., heating, cooling, and/or the like) may result in the photothermal material changing color, such as reverting from the second color to the first color, changing from the second color to a third color, and/or the like. This may allow the light beam of the laser 106 to monochromatically modify particular areas and/or patterns of the rewriteable label 124.

The label support 126 may include a rigid structure that supports the rewriteable label 124. The label support 126 may be configured to withstand an amount of pressure from the label modification unit 100 that permits a sealed enclosure to be formed between the laser containment structure 118 and the rewriteable label 124 and/or the label support 126. In some implementations, the label support 126 may include a label support fitting 128 that is configured around a perimeter of the rewriteable label 124. As shown in FIG. 1, the label support fitting 128 may be a recess in the label support 126, though the label support fitting 128 may include a protrusion and/or other mechanical configuration that facilitates forming a sealed enclosure with the laser containment structure 118, as described herein. The label support 126 may be used to hold the rewriteable label 124, such as on a shelf, and/or the like to create a structure for which the rewriteable label can reside without damaging the rewriteable label 124 (e.g., during a modification of the rewriteable label 124).

As shown in FIG. 1, the laser containment structure 118 may include one or more latches 122 (e.g., clips, clamps, and/or the like) that permit, when in a latched position, the laser containment structure 118 to fasten to (e.g., attach to, connect to, lock onto, and/or the like) the label support 126 to form a sealed enclosure. Such a latch mechanism may be mechanically coupled or controllably coupled with the door 114 to permit the door 114 to open or close based on whether or not the latch mechanism is engaged. For example, when latched, the door 114 may be permitted (e.g., via a mechanical and/or electrically controlled device) to open and/or close, and, when unlatched, the door 114 may be locked (e.g., via a mechanical and/or electrically controlled device) in a closed position. In some implementations, a coupling status associated with the laser containment structure 118 and the rewriteable label 124 can be determined based on a position of the latch 122. In this way, the latches 122 are prevented from breaking (e.g., cannot be unlatched) the sealed enclosure unless the door is in a closed position to maintain the laser printhead 104 within a sealed enclosure (e.g., which may then be formed by the housing 103 and the door 114).

As shown in FIG. 1, the laser printhead assembly 102 may be joined with the laser containment structure 118 and the rewriteable label 124 to modify the rewriteable label 124. When joined, the label modification unit 100 may use the laser printhead 104 to emit and control the light beam to modify the rewriteable label 124.

In some implementations, the label modification unit 100 may be controlled to modify the rewriteable label 124 based on detecting that a sealed enclosure is formed by a seal being formed between the laser containment structure 118 and the rewriteable label 124. As described herein, the seal may prevent the light beam from inadvertently escaping the housing 103 and/or laser containment structure 118 and reaching an environment that surrounds the label modification unit 100, which may damage the surroundings, damage the laser printhead assembly 102, cause inefficiencies in modifying the rewriteable label 124, and/or the like. To ensure the seal is formed, the laser printhead assembly 102 may use the enclosure sensor 110 and/or door sensor 116 to obtain information about the positioning of the label modification unit 100 relative to the rewriteable label 124 to properly align the label modification unit 100 with the rewriteable label 124. For example, the door sensor 116 may determine whether the label-side opening of the laser containment structure 118 is fit to or within the label support fitting 128, whether the flexible seal element 120 is entirely against the rewriteable label 124 and/or label support 126, whether the latches 122 are latched, and/or the like.

Based on aligning the laser printhead assembly 102, the laser containment structure 118, and the rewriteable label 124, the laser printhead assembly 102 and/or the laser containment structure 118 may be abutted with the rewriteable label 124 such that a seal is attempted between the laser containment structure 118 and the rewriteable label 124. In some implementations, the rewriteable label 124 is placed within the label support 126 via the label support fitting 128, and the seal may be formed using the rewriteable label 124, the label support 126, and/or the label support fitting 128 (instead of just the rewriteable label 124). Thus, even though the description herein describes the seal being formed using the rewriteable label 124, the description equally applies to the seal being formed using the label support 126 and/or the label support fitting 128. The flexible seal element 120 of the laser containment structure 118 may be used to assist in forming a seal between the laser containment structure 118 and the rewriteable label 124, the label support 126, and/or the label support fitting 128 by enabling some flexion and/or variability with respect to aligning the label modification unit 100 with the rewriteable label 124, while permitting a sealed enclosure to be formed between the label modification unit 100 and the rewriteable label 124.

The number and arrangement of devices and components shown in FIG. 1 are provided as one or more examples. In practice, there may be additional devices and/or components, fewer devices and/or components, different devices and/or components, or differently arranged devices and/or components than those shown in FIG. 1. Furthermore, two or more devices or components shown in FIG. 1 may be implemented within a single device or component, or a single device or component shown in FIG. 1 may be implemented as multiple, distributed devices or components. Additionally, or alternatively, a set of devices or components shown in FIG. 1 may perform one or more functions described as being performed by another set of devices or components shown in FIG. 1.

Figure 2:
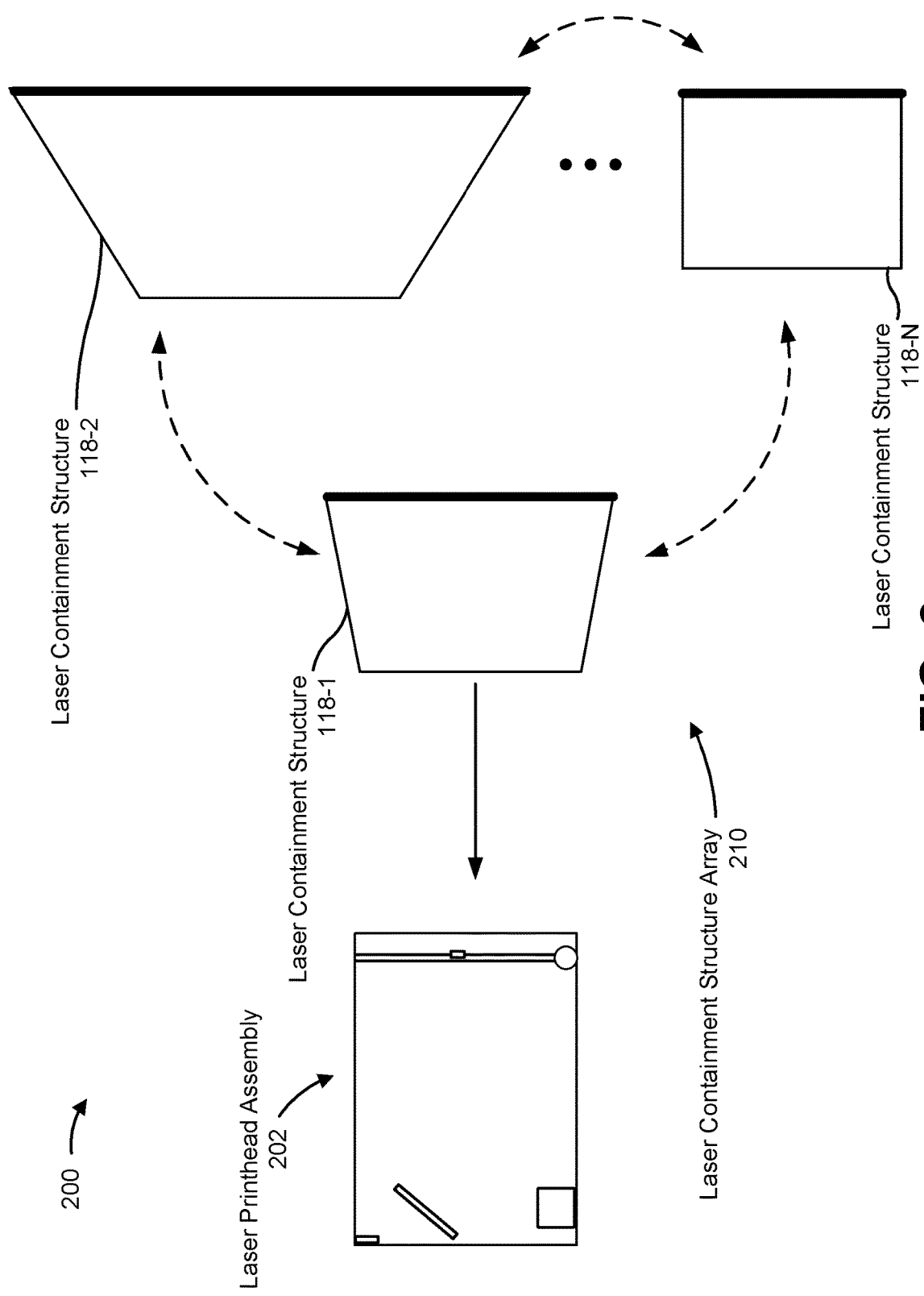
FIG. 2 illustrates an example implementation associated with one or more laser containment structures of the label modification unit of FIG. 1.

FIG. 2 is a diagram of an example implementation 200 associated with one or more laser containment structures of the label modification unit 100 of FIG. 1. As shown in FIG. 2, the laser printhead assembly 202 (e.g., corresponding to the laser printhead assembly 102 of FIG. 1) may be attached to one or more laser containment structures 118-1 to 118-N (referred to individually as laser containment structure 118 and collectively as the laser containment structures 118).

The laser containment structures 118 may be included and/or stored within a laser containment structure array 210 that is accessible to a placement device associated with the label modification unit 100 (e.g., an example of a placement device is described in relation to FIGS. 3A-3D). The laser containment structures 118 may have various sizes, shapes, and/or the like that correspond to particular types of rewriteable labels (e.g., rewriteable label 124) that have corresponding sizes, shapes, and/or the like. One of the laser containment structures 118-1 may be interchangeable with the other laser containment structures 118-2 to 118-N. Accordingly, the laser containment structure 118-1 may be used on a corresponding rewriteable label of matching size, shape, and/or the like to 118-2 to permit a seal to be formed between the laser containment structure 118-1 and the rewriteable label, while the laser containment structure 118-2 may be used on a differently shaped and/or sized rewriteable label. One or more of the laser containment structures 118 may be selected, from a plurality of laser containments structures 118, based on information about a rewriteable label, as described herein.

In this way, the laser containment structures 118, of the laser containment structure array 210, may be interchangeable laser containment structures that permit a sealed enclosure to be formed between the laser printhead assembly 202 and a rewriteable label (and/or label support of the rewriteable label). Correspondingly, the laser containment structures 118 can be configured to individually form sealed enclosures between a plurality of different rewriteable labels and the housing 103 of the laser printhead assembly 102.

As indicated above, FIG. 2 is provided merely as an example. Other examples may differ from what is described with regard to FIG. 2.

FIGS. 3A-3D are diagrams of an example implementation 300 associated with using and/or controlling a label modification unit described herein. Example implementation 300 includes a label modification system, a label management platform, and rewriteable labels (shown as "upper label" and "lower label") positioned within an environment (e.g., on shelves of the environment). The environment may be associated with an entity (e.g., an individual or organization) that stores, manages, rents, and/or sells goods or products that are to be identified by the rewriteable labels (e.g., according to information received from the label management platform). The upper label of example implementation 300 is shown in an operable and/or working condition (e.g., shown by a vertically aligned, unbent support), and the lower label is shown in a damaged and/or inoperable condition (e.g., due to a bent support).

As shown, the label modification system includes a label modification unit (e.g., the label modification unit 100 of FIG. 1), a laser containment structure array (e.g., the laser containment structure array 210 of FIG. 2), a placement device, and a controller. The controller may include one or more devices (e.g., memories, processors, and/or the like) that are configured to control the placement device and/or label modification unit in association with modifying the rewriteable labels. The placement device includes one or more components to move one or more devices of the label modification system. For example, the placement device may include one or more mechanical arms, one or more actuators, one or more drives, one or more motors, and/or the like. The placement device is attached to a laser printhead assembly (shown as being attached at a distal end of the placement device) of the label modification unit.

As described herein, the label modification system may be used to modify (e.g., autonomously and/or semi-autonomously) rewriteable labels in a setting with a plurality of rewriteable labels (e.g., labels of different sizes, shapes, types, and/or the like), such as in a retail store, a warehouse, and/or the like. For example, the controller, based on information and/or instructions from the label management platform, may control the label modification system to modify the rewriteable labels, as described herein. While certain actions and/or operations are described in connection with example implementation 300 as being performed by the controller, such actions and/or operations may be similarly performed and/or caused to be performed by the label management platform.

As shown in FIG. 3A, and by reference number 310, the label modification system moves into a position to use the label modification unit to modify the rewriteable labels. For example, the controller may control one or more devices (e.g., sensors, drives, motors, and/or the like) of the label modification system to navigate the label modification system to the rewriteable labels and/or position the placement device in association with the rewriteable labels. According to some implementations, the label modification system may move into position based on position information (e.g., aisle, shelf, and/or bin information) and/or instructions from the label management platform. For example, the label management platform may provide label information to the label modification system. The label information may include and/or identify one or more of content that is modifiable and/or to be included on the rewriteable labels, identifiers of the rewriteable labels, locations of the rewriteable labels, and/or the like. Accordingly, based on processing the label information and/or identifying an aisle, shelf, and/or bin location of the label, the controller may maneuver the label modification system into a position that permits the placement device and/or the label modification unit to access and modify the upper label and/or the lower label.

In this way, the label modification system may be navigated to the rewriteable labels to permit the label modification system to select a laser containment structure for use in modifying the rewriteable labels, as described herein.

As further shown in FIG. 3A, and by reference number 320, the label modification system selects a laser containment structure to form an enclosure with the upper label. For example, the controller may determine a particular laser containment structure that matches and/or is configured to match the upper label (which may be different from a second laser containment associated with the lower label). The selected laser containment structure may be one of a plurality of laser containment structures stored and/or maintained within the laser containment structure array. As described herein, the containment structure array may hold a variety of laser containment structures (e.g., containment structures of different sizes, shapes, configurations, and/or the like) that are configured to form a sealed enclosure between the laser printhead assembly and the rewriteable labels.

In some implementations, the controller may select the laser containment structure based on an analysis of the upper label. For example, using information from one or more sensors of the label modification system (e.g., the enclosure sensor 110, the door sensor, and/or the like), the controller may be configured to identify (e.g., using an image processing technique) the rewriteable labels and/or a physical configuration (e.g., size and/or shape) of the rewriteable labels. More specifically, an image sensor (such as the door sensor 116 described in relation to FIG. 1) may capture and provide an image that depicts the upper label to controller. The controller may analyze the image (e.g., using an edge detection technique, an object detection technique, an object recognition technique, and/or the like) to determine the physical configuration based on determined dimensions of the upper label from the image. Based on the physical configuration, the controller may select the laser containment structure that matches and/or corresponds to the physical configuration.

Additionally, or alternatively, the controller may analyze a tag and/or identifier associated with the rewriteable labels. The tag and/or identifier of a rewriteable label may be mapped to information that is associated with and/or identifies a particular laser containment structure for the rewriteable label. For example, a sensor of the label modification system (e.g., the door sensor 116, and/or the like) may be used to scan a code (e.g., a matrix barcode, a linear barcode, a text code, and/or the like) that indicates a particular laser containment structure to be used to modify the upper label.

Using an analysis of the rewriteable labels, as described herein, the controller and/or label management system can be configured to dynamically identify and/or determine a laser containment structure for a particular rewriteable label without having to update and/or maintain a mapping of label information for the rewriteable labels in the environment.

In some implementations, the label modification system may send (e.g., via a communication device, a communication link, a network, and/or the like) captured label information to the label management platform to determine which laser containment structure corresponds to the upper label. The label management platform may include a data structure or be able to access a data structure that contains various information associated with the rewriteable labels. For example, the label management platform may have information associated with rewriteable labels in a particular environment, along with various information associated with the rewriteable labels, such as information identifying: a size of a rewriteable label, a location of a rewriteable label (e.g., information identifying an aisle location, a shelf location, a bin location, and/or the like), an item associated with a rewriteable label (e.g., a product the rewriteable label is associated with, and/or the like), a laser containment structure associated with a rewriteable label, a price associated with a rewriteable label, content associated with a rewriteable label, and/or the like.

Additionally, or alternatively, the controller may select the laser containment structure based on receiving information from the label management platform that identifies a particular containment structure for the upper label and/or based on the location of the upper label (e.g., the location may be mapped to a particular laser containment structure in a label location mapping or other data structure of the label modification system). In this way, the controller may conserve computing resources (e.g., processing resources, memory resources, and/or communication resources used to analyze sensor information and/or images associated with the rewriteable labels) associated with selecting the laser containment structure by using a static mapping and/or information.

In association with identifying a laser containment structure for the upper label, the controller may control the placement device to attach the selected laser containment structure to the laser printhead assembly. For example, the controller may control the placement device to fit the laser containment structure to the laser printhead assembly (e.g., via a coupling and/or fitting of the laser printhead assembly and/or the laser containment structure). In some implementations, the placement device may remove a laser containment structure that is attached to the laser printhead assembly (e.g., by returning that laser containment structure to the laser containment structure array) from the laser printhead assembly prior to attaching the selected laser containment structure to the laser printhead assembly.

Figure 3B:
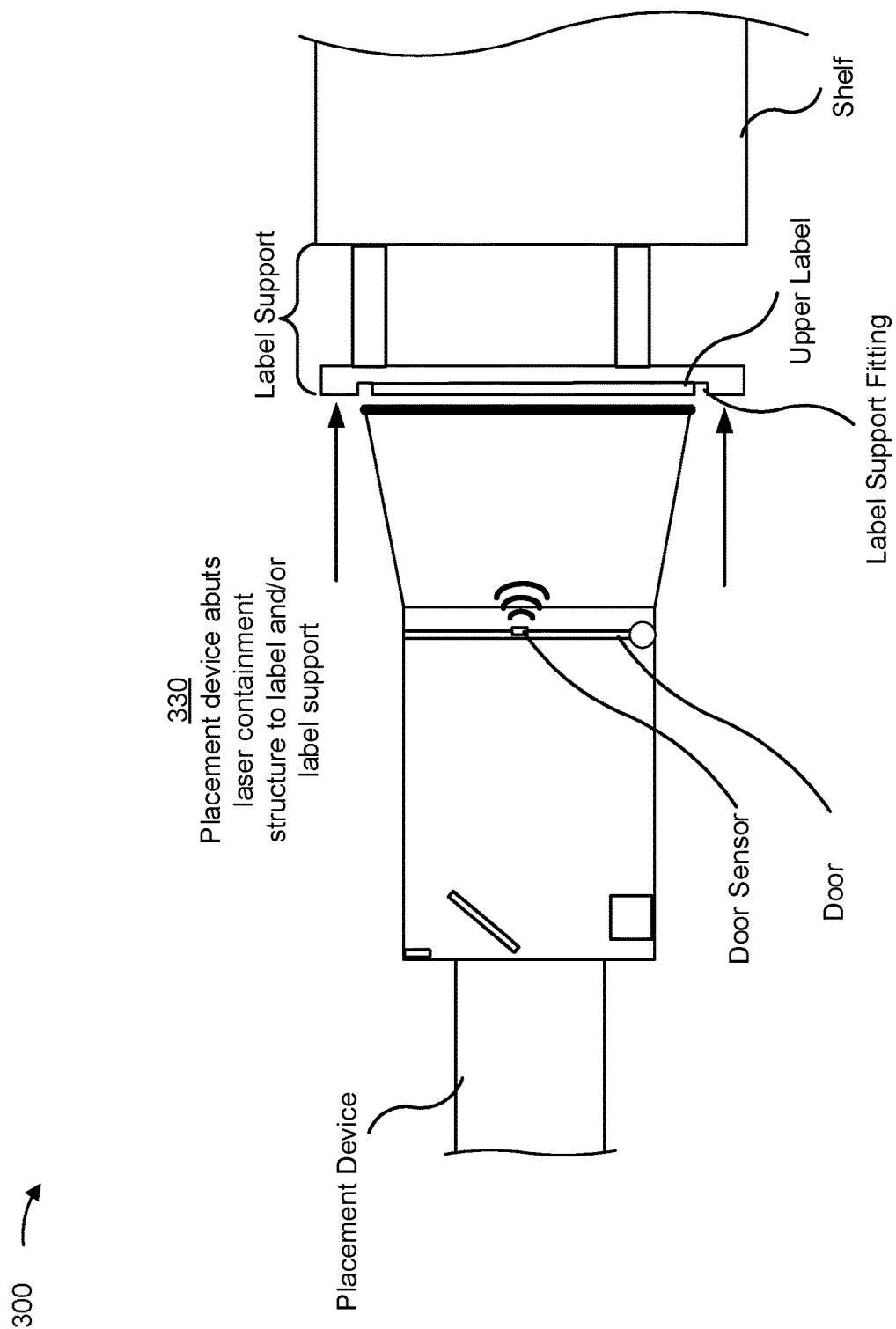

As shown in FIG. 3B, and by reference number 330, the placement device abuts the laser containment structure to the upper label. For example, the controller, using information from one or more sensors of the label modification system and/or the label management platform, may control the placement device to position the label-side opening of the laser containment structure against and/or around the upper label. As a more specific example, the controller may use a sensor (e.g., the door sensor 116) to identify the upper label, determine a position of the upper label relative to the label modification unit and/or the label-side opening of the laser containment structure, and correspondingly align the laser containment structure with the upper label. Additionally, or alternatively, the controller may use location information associated with the upper label and corresponding position information of the placement device (e.g., that identifies preconfigured position settings of mechanical components of the placement device to abut the laser containment structure to the upper label) to position the placement device to form a sealed enclosure between the laser containment structure and the upper label.

As shown in FIG. 3B, the upper label is affixed to the shelf via a label support (e.g., the label support 126 of FIG. 1) that includes a label support fitting (e.g., the label support fitting 128 of FIG. 1). The controller may cause the placement device to press the laser containment structure against the upper label and/or position the label-side end of the laser containment structure to be within the label support fitting. In some implementations, a flexible seal element (e.g., the flexible seal element 120 of FIG. 1) on the laser containment structure may compress with contact to facilitate the formation of a seal and/or a sealed enclosure between the laser containment structure and the upper label and/or between the laser containment structure and the label support.

According to some implementations, based on determining that the label modification unit and upper label are in position for label modification (e.g., using the door sensor and/or an enclosure sensor, such as the enclosure sensor 110 of FIG. 1), the controller may open a door, to verify that a sealed enclosure that includes the upper label and/or the laser printhead is formed and/or permit the label modification unit to modify the upper label.

Figure 3C:
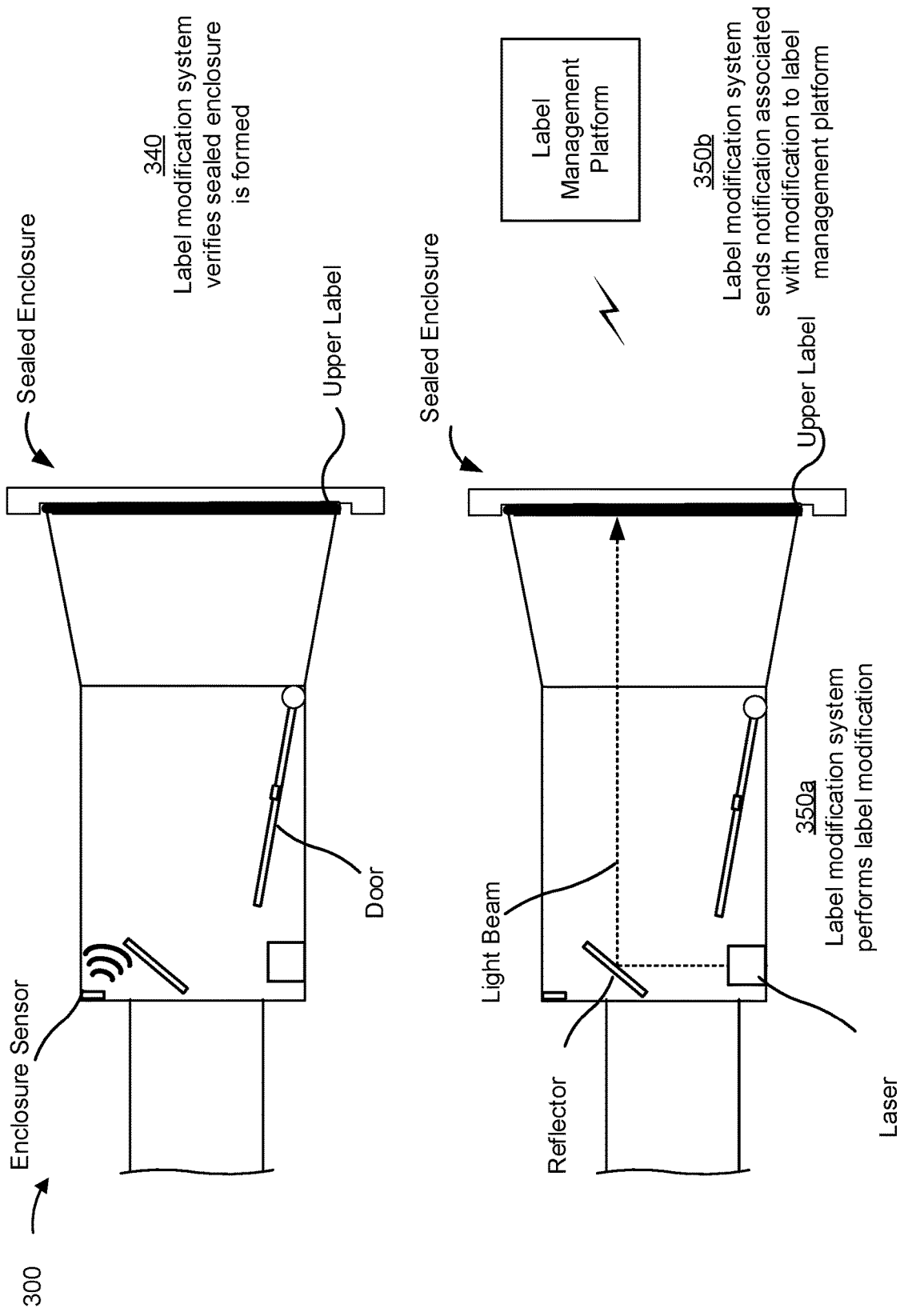

As shown in FIG. 3C, and by reference number 340, the label modification system verifies that a sealed enclosure is formed. For example, to verify that a sealed enclosure has been formed, the label modification system may obtain seal information from an enclosure sensor of the label modification unit (and/or other sensor of the label modification system, such as the door sensor 116 of FIG. 1 or another sensor used to control the placement device). Based on the seal information, the label modification system may determine a coupling status associated with the laser containment structure and the rewriteable label, which may indicate whether the laser containment structure and rewriteable label (or label support) are coupled (and/or latched) to form the sealed enclosure.

As described herein, when the upper label and label modification unit are positioned to form a sealed enclosure (e.g., when the laser containment structure is coupled to the upper label, coupled to the label support fitting, and/or the like), the laser containment structure forms a seal with the upper label and/or label support that encloses the upper label (or at least a portion of the upper label that is to be modified) within the sealed enclosure (e.g., with a laser of the laser printhead assembly when a door of the laser printhead assembly is opened). As described herein, the sensor may include any suitable sensor that is capable of detecting whether a sealed enclosure that includes the upper label has been formed. More specifically, the enclosure sensor may include a camera that provides one or more images (e.g., as seal information) to the controller to permit the controller to determine (e.g., using an image processing technique) a seal status of a seal between the upper label and the laser containment structure. The seal status may indicate whether the one or more images depicts a seal or a gap (e.g., an air gap that exists because a seal is not formed, an opening that is greater than a threshold distance or area, and/or the like) between the upper label and the laser containment structure. Additionally, or alternatively, the enclosure sensor may include a pressure sensor to detect whether a sealed enclosure has been formed and/or that provides seal information that indicates whether there is a change in pressure or a difference in pressure between an interior atmosphere and exterior atmosphere of the label modification unit). In some implementations, the enclosure sensor may include a light sensor that is configured to measure a level of ambient light and/or to provide seal information that indicates whether a gap is permitting ambient light to travel between the laser containment structure and the upper label and/or label support. The controller, based on seal information from the enclosure sensor may determine that the seal is formed based on whether the seal information includes and/or identifies a value (e.g., a data value, a pressure value, a light value, and/or the like) that satisfies a particular threshold.

In this way, based on the verifying the sealed enclosure, the controller may permit the label modification unit to modify the upper label.

As shown in FIG. 3C, and by reference number 350a, the label modification system performs the label modification. For example, the controller may cause the laser printhead to modify the upper label with content that has been received from the label management platform (e.g., within label information and/or instructions from the label management platform to update the upper label and/or the lower label) and/or input to the label modification system (e.g., via a user). The label modification may be performed based on verifying the sealed enclosure is formed. For example, the controller may permit and/or cause the laser printhead to perform a write or erase of the upper label only when the controller verifies that the upper label is within a sealed enclosure that includes both the upper label and at least a portion of the laser printhead.

As described herein, to perform the label modification, the laser printhead causes the laser of the laser printhead assembly to emit a light beam and/or controls a reflector of the label modification system to direct the light beam onto the upper label to perform the label modification. A label modification may include various actions to modify a rewriteable label, such as writing content on the rewriteable label, removing modifiable content from the rewriteable label, altering modifiable content on the rewriteable label, and/or the like (e.g., based on causing the rewriteable label to photothermally react according to attributes of the light beam).

As shown in FIG. 3C, and by reference number 350b, the label modification system sends a notification associated with the modification to the label management platform. For example, the controller may send, via a communication device, a verification message to confirm that the upper label was successfully modified.

Accordingly, the label management platform may correspondingly update label information associated with the upper label (e.g., in a data structure for tracking label information associated with the rewriteable labels of the environment). The label information may identify that the upper label is in a working condition, that the upper label has been updated with new content, the new content used to update the upper label, timing associated with performing the label modification, and/or the like. In this way, the controller may permit the label management platform to keep up-to-date information associated with the rewriteable labels to enable monitoring and/or detection maintenance requirements of the rewriteable labels, content on the rewriteable labels, and/or the like.

Figure 3D:
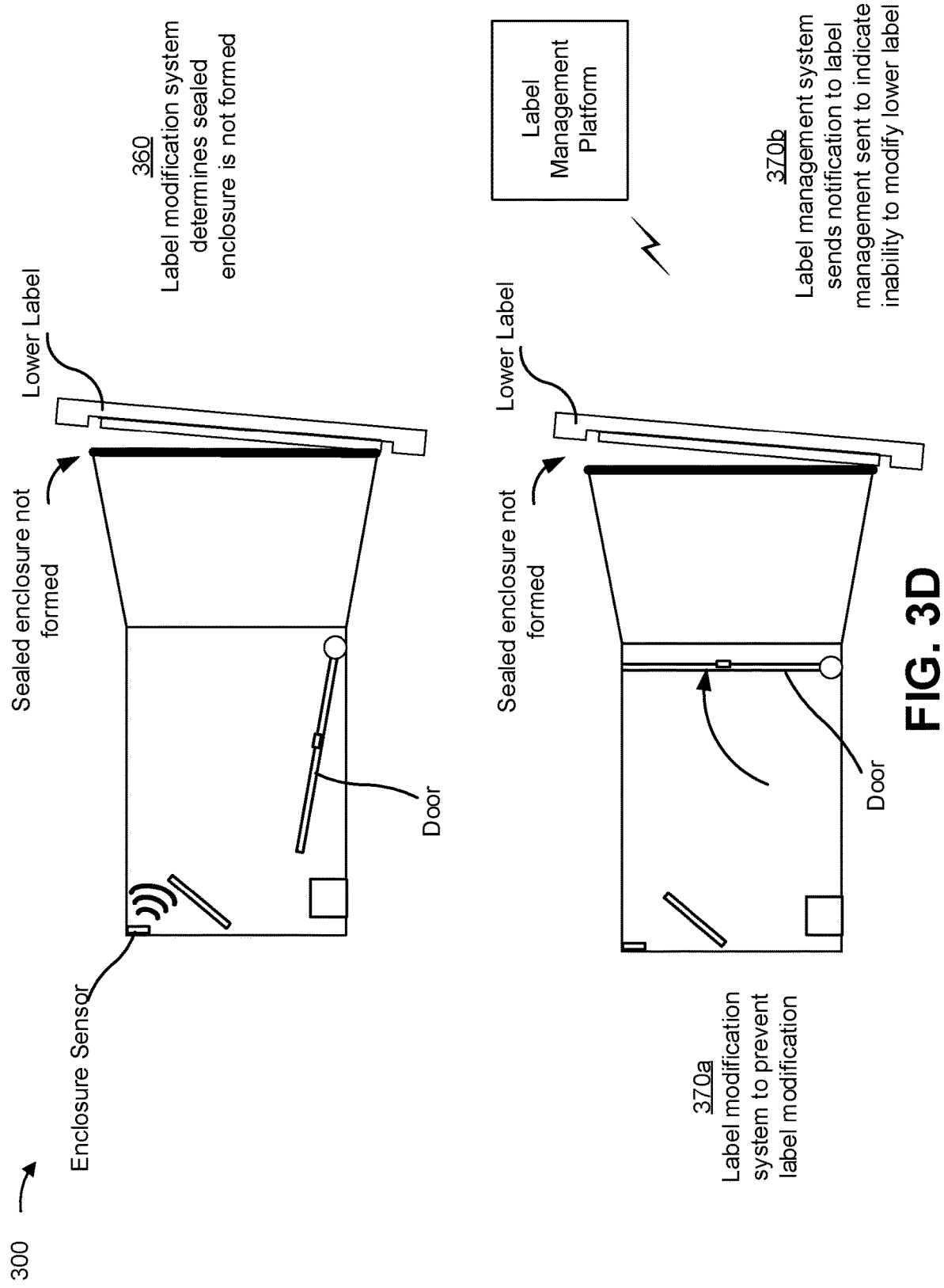

As shown in FIG. 3D, and by reference number 360, the label modification system determines that a sealed enclosure is not formed with the lower label. For example, after modifying the upper label, the controller may cause the placement device to align (or attempt to align) the placement device with the lower label (in a similar manner as described above in connection with the upper label). However, as previously mentioned, the lower label may have sustained some damage or may have been altered in a manner that the placement device is prevented (e.g., due to mechanical and/or control constraints) from positioning the label modification unit to form a sealed enclosure that includes the rewriteable label (e.g., if the controller is not configured to dynamically adapt the label modification unit to a damaged, repositioned, or altered rewriteable label).

Accordingly, based on seal information received from the enclosure sensor indicating that a gap exists between the laser containment structure of the label modification unit and the lower and/or between the laser containment structure and the label support, the controller may determine that the sealed enclosure is not formed. Such seal information may include an image that depicts an air gap between the laser containment structure and the lower label, a pressure measurement that indicates that a seal has not been formed, and/or an ambient light measurement that indicates that ambient light is reaching the laser containment structure and/or the housing of the laser printhead assembly. In this way, the controller may determine that a sealed enclosure has not been formed between the label modification unit and the lower label.

As shown in FIG. 3D, and by reference number 370a, the label modification system prevents label modification of the lower label. For example, because a sealed enclosure was not formed with the lower label, the controller may close the door of the laser printhead assembly to prevent a light beam from the laser (e.g., if inadvertently activated) from passing through the gap between the lower label and the laser containment structure and/or reaching an exterior of the label modification unit. Accordingly, any inadvertent emission of a light beam by the laser can be contained within the laser printhead assembly, to prevent damage to external components or objects within the environment (e.g., due to the light beam heating the objects).

As shown in FIG. 3D, and by reference number 370b, the label modification system sends a notification to the label management platform to indicate an inability to modify the lower label. For example, the controller may send an alert and/or error message to the label management platform that indicates that the lower label is likely damaged and/or that the lower label was not modified.

Accordingly, the label management platform may correspondingly update label information for the label and/or indicate that the lower label requires maintenance (e.g., via a notification to a user device associated with the label management platform). Because the lower label of example implementation 300 may display incorrect information, the notification from the label modification system can prevent further errors associated with incorrect labeling of the lower label (e.g., incorrect identification of items associated with the labels, incorrect pricing of items associated with the lower label, and/or the like). Moreover, damaged labels may cause problems for other devices that are configured to interact with the damaged labels (e.g., other label modification systems). Therefore, the label modification system, via such notifications to the label management platform, can conserve resources associated with the other devices attempting to interact with a damaged label.

According to some implementations, the label modification system may be configured to dynamically adjust to repositioned or damaged rewriteable labels (such as the lower label) using one or more sensors and/or the placement device to align the label modification unit with the repositioned or damaged rewriteable labels. Additionally, or alternatively, the label modification system may include one or more devices (e.g., the placement device or other type of mechanical device) that is configured to adjust, repair, replace, and/or reconfigured repositioned or damaged rewriteable labels.

In this way, the label modification system of example implementation 300 can enable the label modification unit to modify a rewriteable label, can detect a status of a rewriteable label, and/or can provide information associated with a rewriteable label, as described herein.

As indicated above, FIGS. 3A-3D are provided merely as examples. Other examples may differ from what is described with regard to FIGS. 3A-3D.

Figure 4:
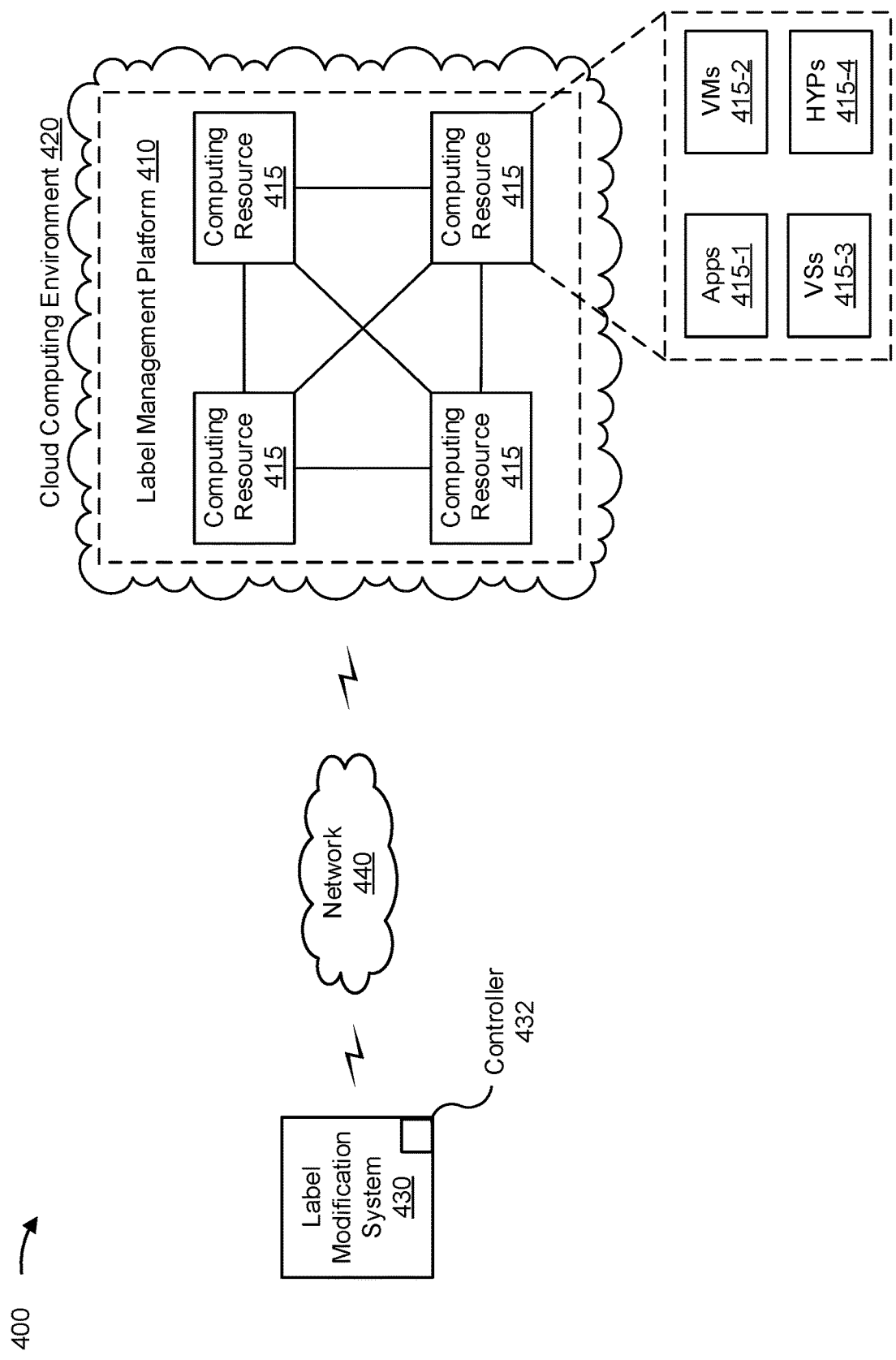
FIG. 4 illustrates an example environment in which systems and/or methods described herein may be implemented.

FIG. 4 is a diagram of an example environment 400 in which systems and/or methods, described herein, may be implemented. As shown in FIG. 4, environment 400 may include a label management platform 410 (e.g., the label management platform of example implementation 300) that is hosted by computing resources 415 of a cloud computing environment 420, a label modification system 430 (e.g., the label modification system of example implementation 300) with a controller 432 (e.g., corresponding to the controller of example implementation 300), and a network 440. Devices of the environment 400 may interconnect via wired connections, wireless connections, or a combination of wired and wireless connections.

The label management platform 410 includes one or more devices that manage information associated with labelling one or more rewriteable labels of an environment, as described herein. In some implementations, the label management platform 410 may be designed to be modular such that certain software components may be swapped in or out depending on a particular need. As such, the label management platform 410 may be easily and/or quickly reconfigured for different uses. The label management platform 410 may receive information from and/or transmit information to label modification system 430 (and/or the controller 432), as described herein.

In some implementations, as shown, the label management platform 410 may be hosted in the cloud computing environment 420. Notably, while implementations described herein describe the label management platform 410 as being hosted in the cloud computing environment 420, in some implementations, the label management platform 410 may not be cloud-based (i.e., may be implemented outside of a cloud computing environment) or may be partially cloud-based.

The cloud computing environment 420 includes an environment that hosts the label management platform 410. The cloud computing environment 420 may provide computation, software, data access, storage, etc., services that do not require end-user knowledge of a physical location and configuration of system(s) and/or device(s) that hosts the label management platform 410. As shown, the cloud computing environment 420 may include a group of the computing resources 415 (referred to collectively as "computing resources 415" and individually as "computing resource 415").

The computing resource 415 includes one or more personal computers, workstation computers, mainframe devices, or other types of computation and/or communication devices. In some implementations, the computing resource 415 may host the label management platform 410. The cloud resources may include compute instances executing in the computing resource 415, storage devices provided in the computing resource 415, data transfer devices provided by the computing resource 415, etc. In some implementations, a computing resource 415 may communicate with other computing resources 415 via wired connections, wireless connections, or a combination of wired and wireless connections.

As further shown in FIG. 4, one or more of the computing resources 415 may include a group of cloud resources, such as one or more applications ("APPs") 415-1, one or more virtual machines ("VMs") 415-2, virtualized storage ("VSs") 415-3, one or more hypervisors ("HYPs") 415-4, and/or the like.

The application 415-1 includes one or more software applications that may be provided to or accessed by the label management platform 410. The application 415-1 may eliminate a need to install and execute the software applications on the label management platform 410. For example, application 415-1 may include software associated with the label management platform 410 and/or any other software capable of being provided via the cloud computing environment 420. In some implementations, one application 415-1 may send/receive information to/from one or more other applications 415-1 via virtual machine 415-2.

The virtual machine 415-2 includes a software implementation of a machine (e.g., a computer) that executes programs like a physical machine. The virtual machine 415-2 may be either a system virtual machine or a process virtual machine, depending upon use and degree of correspondence to any real machine by the virtual machine 415-2. A system virtual machine may provide a complete system platform that supports execution of a complete operating system ("OS"). A process virtual machine may execute a single program and may support a single process. In some implementations, the virtual machine 415-2 may execute on behalf of a user (e.g., an operator of the label management platform 410), and may manage infrastructure of the cloud computing environment 420, such as data management, synchronization, or long-duration data transfers.

The virtualized storage 415-3 includes one or more storage systems and/or one or more devices that use virtualization techniques within the storage systems or devices of the computing resource 415. In some implementations, within the context of a storage system, types of virtualizations may include block virtualization and file virtualization. Block virtualization may refer to abstraction (or separation) of logical storage from physical storage so that the storage system may be accessed without regard to physical storage or heterogeneous structure. The separation may permit administrators of the storage system flexibility in how the administrators manage storage for end users. File virtualization may eliminate dependencies between data accessed at a file level and a location where files are physically stored. This may enable optimization of storage use, server consolidation, and/or performance of non-disruptive file migrations.

The hypervisor 415-4 may provide hardware virtualization techniques that allow multiple operating systems (e.g., "guest operating systems") to execute concurrently on a host computer, such as computing resource 415. The hypervisor 415-4 may present a virtual operating platform to the guest operating systems and may manage the execution of the guest operating systems. Multiple instances of a variety of operating systems may share virtualized hardware resources.

The label modification system 430 includes a system for modifying a rewriteable label. The label modification system 430 may include a label modification unit (e.g., the label modification unit 100 of FIG. 1), a laser containment structure array (e.g., the laser containment structure array 210 of FIG. 2), the controller 432, and/or the like to permit the label modification system 430 to navigate to and/or modify (e.g., autonomously or semi-autonomously) one or more rewriteable labels. The controller 432 may include one or more devices (e.g., one or more processors, one or more memories, and/or the like) that are capable of controlling one or more components of the label modification system 430, as described herein. Accordingly, the label modification system 430 may include and/or control a laser printhead (e.g., the laser printhead 104) to adjust attributes of a light beam that is emitted and/or directed by the laser printhead to write and/or erase a rewriteable label, as described herein.

The network 440 includes one or more wired and/or wireless networks. For example, the network 440 may include a cellular network (e.g., a fifth generation (5G) network, a long-term evolution (LTE) network, a third generation (3G) network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, and/or the like, and/or a combination of these or other types of networks.

The number and arrangement of devices and networks shown in FIG. 4 are provided as one or more examples. In practice, there may be additional devices and/or networks, fewer devices and/or networks, different devices and/or networks, or differently arranged devices and/or networks than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
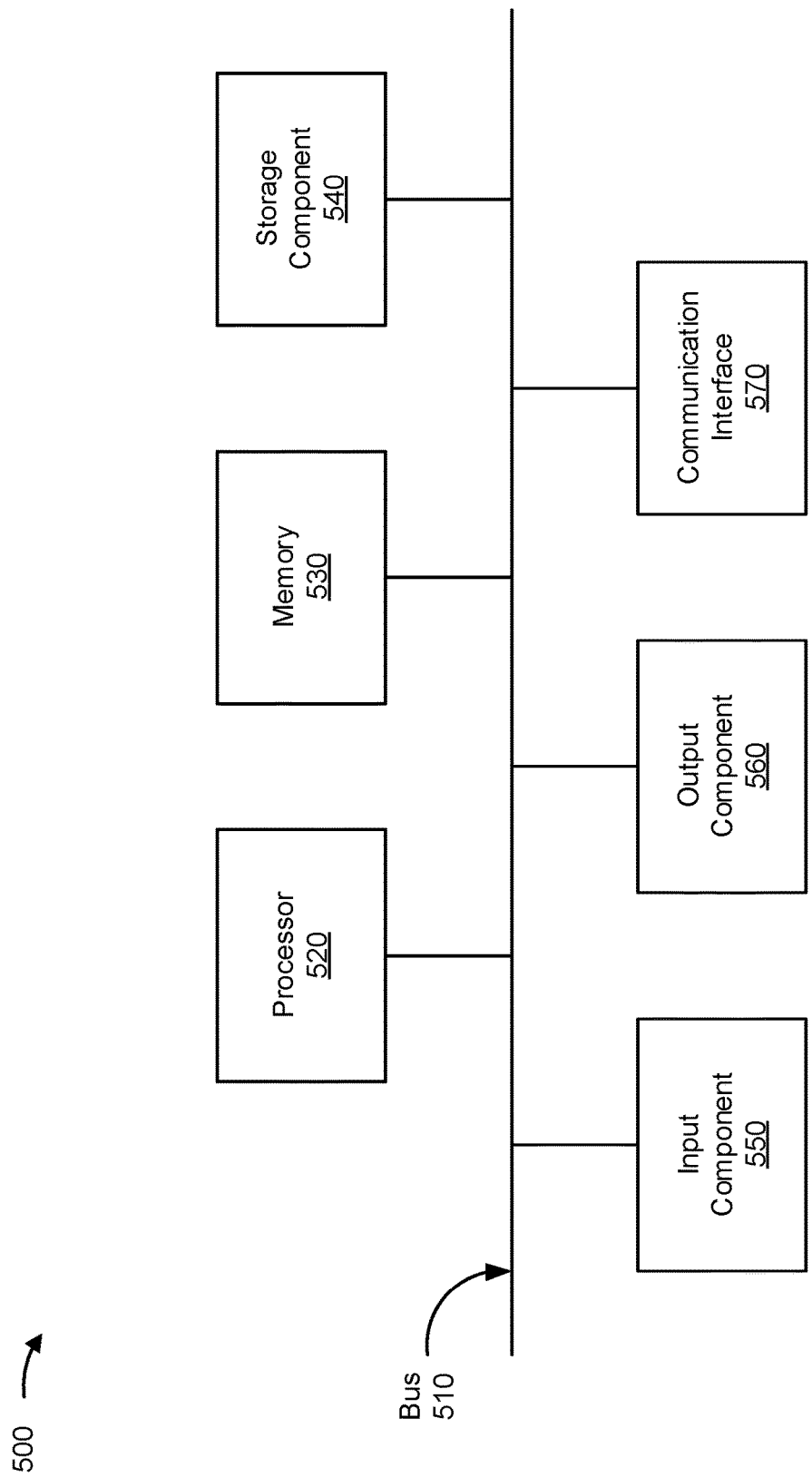
FIG. 5 illustrates example components of one or more devices of FIG. 4

FIG. 5 is a diagram of example components of a device 500. Device 500 may correspond to the label management platform 410, the label modification system 430, the controller 432, and/or the like. In some implementations, the label management platform 410, label modification system 430, and/or the controller 432 may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among multiple components of device 500. Processor 520 is implemented in hardware, firmware, and/or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a component for determining location (e.g., a global positioning system (GPS) component) and/or a sensor (e.g., an accelerometer, a gyroscope, an actuator, another type of positional or environmental sensor, and/or the like) to navigate and/or control the label modification system 430. For example, input component 550 may include and/or be associated with the enclosure sensor 110 and/or the door sensor 116 of FIG. 1. Output component 560 includes a component that provides output information from device 500 (via, e.g., a display, a speaker, a haptic feedback component, an audio or visual indicator, and/or the like). Additionally, or alternatively, output component 560 may include and/or be associated with components of the laser printhead 104 and/or one or more control devices (e.g., electromechanical devices) configured to control components of the label modification unit and/or components of the placement device of example implementation 300.

Communication interface 570 includes a transceiver-like component (e.g., a transceiver, a separate receiver, a separate transmitter, and/or the like) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, a radio frequency (RF) interface, a universal serial bus (USB) interface, a wireless local area network interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. As used herein, the term "computer-readable medium" refers to a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

FIG. 6 is a flowchart of an example process 600 for configuring a sealed enclosure for a laser printhead. In some implementations, one or more process blocks of FIG. 6 may be performed by a label modification system (e.g., the label modification system 430). In some implementations, one or more process blocks of FIG. 6 may be performed by another device or a group of devices separate from or including the label modification system, such as a label management platform (e.g., the label management platform 410) and/or the like.

As shown in FIG. 6, process 600 may include determining a physical configuration of a rewriteable label, wherein content is to be modified on the rewriteable label using a laser printhead (block 610). For example, the label modification system (e.g., using processor 520, memory 530, storage component 540, input component 550, output component 560, communication interface 570, and/or the like) may determine a physical configuration of a rewriteable label, as described above. In some implementations, content is modifiable and/or is to be modified on the rewriteable label using a laser printhead and the rewriteable label is supported by a label support.

The label modification system, when determining the physical configuration of the rewriteable label, may obtain location information that identifies a location of the rewriteable label and identify, based on the location and a label location mapping, the physical configuration, the label location mapping including an entry for the rewriteable label that associates the location and the physical configuration. Additionally, or alternatively, the label modification system, when determining the physical configuration of the rewriteable label, may identify an identifier of the rewriteable label based on an analysis of an image of the rewriteable label that is captured by a camera of a placement device and determine the physical configuration based on the identifier. The identifier may be depicted in the image. Additionally, or alternatively, the identifier may be identified based on a location of the rewriteable label and/or a location of a placement device. In some implementations, the label modification system may analyze, via an image processing technique, the image to determine the physical configuration of the rewriteable label based on one or more dimensions of the rewriteable label.

As further shown in FIG. 6, process 600 may include selecting a laser containment structure that is associated with the physical configuration, wherein the laser containment structure is one of a plurality of laser containment structures that are accessible to a placement device (block 620). For example, the label modification system (e.g., using processor 520, memory 530, storage component 540, input component 550, output component 560, communication interface 570, and/or the like) may select a laser containment structure that is associated with the physical configuration, as described above.

The laser containment structure may include a first opening that is configured to fit a printhead structure of the laser printhead and a second opening that is configured to fit a rewriteable label support fitting. In some implementations, selecting the laser containment structure may include determining, based on the physical configuration, that a label-side opening of the laser containment structure matches the label support fitting of the rewriteable label, and causing the placement device to select the laser containment structure for positioning in association with the rewriteable label.

In some implementations, the label modification system, when selecting the laser containment structure, may analyze a plurality of label-side openings of the plurality of laser containment structures, determine that a label-side opening of the plurality of label-side openings, that is associated with the laser containment structure, matches the physical configuration of the rewriteable label, and select the laser containment structure based on the label-side opening matching the physical configuration.

As further shown in FIG. 6, process 600 may include causing the placement device to position the laser containment structure in association with the rewriteable label to form a sealed enclosure that includes the laser printhead (block 630). For example, the label modification system (e.g., using processor 520, memory 530, storage component 540, input component 550, output component 560, communication interface 570, and/or the like) may cause the placement device to position the laser containment structure in association with the rewriteable label to form a sealed enclosure that includes the laser printhead, as described above.

In some implementations, the label modification system, when positioning the laser containment structure, may obtain position information associated with the label support fitting and the laser containment structure and control the placement device to position the laser containment structure according to the positioning information.

In some implementations, the label modification system may obtain, from a sensor associated with the sealed enclosure, seal information associated with coupling the laser containment structure and a label support fitting of the label support. The label modification system, when obtaining the seal information, may analyze an image captured by a camera; determine, from the image, a seal status of a seal between the label support fitting and the laser containment structure; and generate, based on the seal status, the seal information. In such a case, the seal information may be generated based on the seal status indicating that a gap between the label support fitting and the laser containment structure is depicted in the image or the seal status indicating a seal between the label support fitting and the laser containment structure is depicted in the image.

In some implementations, causing the placement device to position the laser containment structure may include causing the placement device, using a sensor of the placement device, to align the label support fitting with a label-side opening of the laser containment structure and coupling the label-side opening to the label support fitting of the rewriteable label to form the sealed enclosure.

In some implementations, process 600 may include causing a placement device, using a sensor of the placement device, to align the rewriteable label with a label-side opening of the laser containment structure; and causing the placement device to couple the label-side opening fitting to a label support fitting of the rewriteable label to form the sealed enclosure. In some implementations, process 600 may include verifying a seal is formed, wherein the action is performed based on verifying that the sealed enclosure is formed. Process 600 may include analyzing an image captured by a camera, determining that the image does not depict a gap between the rewriteable label and the laser containment structure, and confirming, based on determining that the image does not depict a gap between the rewriteable label and the laser containment structure, that the sealed enclosure is formed.

As further shown in FIG. 6, process 600 may include performing, based on a seal status associated with the laser containment structure and the rewriteable label, an action associated with the rewriteable label (block 640). For example, the label modification system (e.g., using processor 520, memory 530, storage component 540, input component 550, output component 560, communication interface 570, and/or the like) may perform the action associated with the rewriteable label, as described above. The seal status may indicate that a gap or a seal between the laser containment structure and the rewriteable label.

The label modification system, when performing the action, may enable, based on the seal enclosure being formed, the laser printhead to modify content on the rewriteable label, or prevent, based on the sealed enclosure not being formed, the laser printhead from modifying content on the rewriteable label. Additionally, or alternatively, the label modification system may cause the laser printhead to modify content on the rewriteable label or send, to a label management platform, a notification associated with modifying the rewriteable label. In some implementations, performing the action includes causing a laser printhead assembly to place a laser printhead door into an open position, causing the laser printhead to modify the rewriteable label, and causing, after the laser printhead modifies content of the rewriteable label, the laser printhead assembly to place the laser printhead door into a laser-disabled position.

Process 600 may include additional implementations, such as any single implementation or any combination of implementations described above and/or in connection with one or more other processes described elsewhere herein.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

As used herein, each of the terms "tangible machine-readable medium," "non-transitory machine-readable medium" and "machine-readable storage device" is expressly defined as a storage medium (e.g., a platter of a hard disk drive, a digital versatile disc, a compact disc, flash memory, read-only memory, random-access memory, etc.) on which machine-readable instructions (e.g., program code in the form of, for example, software and/or firmware) are stored for any suitable duration of time (e.g., permanently, for an extended period of time (e.g., while a program associated with the machine-readable instructions is executing), and/or a short period of time (e.g., while the machine-readable instructions are cached and/or during a buffering process)). Further, as used herein, each of the terms "tangible machine-readable medium," "non-transitory machine-readable medium" and "machine-readable storage device" is expressly defined to exclude propagating signals. That is, as used in any claim of this patent, none of the terms "tangible machine-readable medium," "non-transitory machine-readable medium," and "machine-readable storage device" can be read to be implemented by a propagating signal.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present disclosure. Additionally, the described embodiments/examples/implementations should not be interpreted as mutually exclusive and should instead be understood as potentially combinable if such combinations are permissive in any way. In other words, any feature disclosed in any of the aforementioned embodiments/examples/implementations may be included in any of the other aforementioned embodiments/examples/implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

The benefits, advantages, solutions to problems, and any element(s) that may cause any benefit, advantage, or solution to occur or become more pronounced are not to be construed as a critical, required, or essential features or elements of any or all the claims. The claimed invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus, the following claims are hereby incorporated into the Detailed Description, with each claim standing on its own as a separately claimed subject matter.

The invention claimed is:

1. A laser printhead assembly for a laser printhead, the laser printhead assembly comprising:
   a laser containment door;
   a laser containment housing that is configured to form a sealed enclosure with a label support of a rewriteable label; and
   a latch,
   wherein the latch is configured to fasten the laser containment housing to the label support to form the sealed enclosure,
   wherein the sealed enclosure is configured to include the rewriteable label and the laser printhead,
   wherein the laser containment door, in a laser-enabled position, is configured to permit the laser printhead, via a light beam, to modify the rewriteable label, and wherein the laser containment door, in a laser-disabled position, is configured to prevent the light beam from escaping the laser containment housing.

2. The laser printhead assembly of claim 1, wherein the laser containment housing comprises:
   a laser containment structure that includes an opening that is configured to fit a label support fitting of the label support; and
   a laser-side end that is opposite the opening.

3. The laser printhead assembly of claim 2, wherein the laser containment door is situated between the opening and the laser-side end.

4. The laser printhead assembly of claim 2, wherein the laser containment structure includes a flexible seal element that is configured in association with the opening to engage the label support to form the sealed enclosure.

5. The laser printhead assembly of claim 1, wherein the laser containment door is configured to be locked in the laser-disabled position unless the sealed enclosure is formed with a label support fitting of the label support.

6. The laser printhead assembly of claim 1, further comprising:
   a latch that is attached to the laser containment housing, wherein the latch is configured to fasten the laser containment housing to form the sealed enclosure.

7. The laser printhead assembly of claim 6, wherein, after the sealed enclosure is formed via the latch, the latch is configured to maintain the sealed enclosure unless the laser containment door is in the laser-disabled position.

8. A label modification unit comprising:
   a laser printhead assembly that is configured to modify, via a light beam, a rewriteable label that is mounted to a label support; and
   a laser containment housing, comprising:
      a label-side end that includes an opening,
         wherein the opening is configured to match a label support fitting of the label support;
      a latch,
         wherein the latch is configured to fasten the laser containment housing to the label support to form a sealed enclosure;
      a laser-side end that is opposite the label-side end,
         wherein the laser printhead assembly is positioned at the laser-side end; and
      a laser containment door that is between the laser-side end and the label-side end,
         wherein, based on whether the sealed enclosure is formed between the laser containment housing and the label support fitting, the laser containment door is configured to:
            enable the light beam to pass through the opening to modify the rewriteable label when the sealed enclosure is formed, or
            prevent the light beam from escaping the laser containment housing when the sealed enclosure is not formed.

9. The label modification unit of claim 8, wherein the laser containment housing comprises:
   a light beam passageway that is configured to be opened or closed by the laser containment door,
   wherein the laser containment door is prevented from opening the light beam passageway unless the laser containment housing has formed the sealed enclosure.

10. The label modification unit of claim 9, wherein the laser containment door is a hinged door.

11. The label modification unit of claim 9, wherein the laser containment door is a sliding door that is configured to be:
    slidably removed from the light beam passageway to open the light beam passageway to permit the light beam to modify the rewriteable label, or
    slidably placed into the light beam passageway to close the light beam passageway.

12. The label modification unit of claim 9, the latch is controllably coupled with the laser containment door according to at least one of:
    the laser containment door being prevented from enabling the light beam to pass through the opening unless the latch is in a latched position to form the sealed enclosure, and
    the latch being prevented from breaking the sealed enclosure unless the laser containment door is in a closed position.

13. A label modification system comprising:
    a placement device; and
    a label modification unit, movable by the placement device, the label modification unit comprising:
       a laser printhead assembly;
       a laser containment structure that includes an opening at a label-side end of the label modification unit,
          wherein the opening is configured to be aligned, by the placement device, with a label support fitting associated with a rewriteable label; and
       a laser containment door that is between the laser containment structure and the laser printhead assembly,
          wherein the laser containment door is configured to maintain a laser printhead of the laser printhead assembly within a sealed enclosure.

14. The label modification system of claim 13, wherein the laser containment door that is configured to open or close a light beam passageway, associated with a light beam of the laser printhead,
    wherein the light beam passageway extends from the laser printhead assembly, through the laser containment structure, and to the opening.

15. The label modification system of claim 13, wherein, when a seal is formed between the label-side end and the label support fitting, the laser containment door is configured to be opened to permit the laser printhead to be maintained within a sealed enclosure that includes the rewriteable label.

16. The label modification system of claim 13, wherein, when a seal is not formed between the label-side end and the label support fitting, the laser containment door is configured to maintain the laser printhead within a housing of the laser printhead assembly that does not include the rewriteable label.

17. The label modification system of claim 13, wherein the label modification unit includes:
    a latch attached to the laser containment structure,
       wherein the latch is configured to engage with a label support of the rewriteable label to form a seal between the label-side end and the label support fitting.

18. The label modification system of claim 13,
    wherein the laser containment structure is interchangeable with one or more of a plurality of laser containment structures,
    wherein the plurality of laser containment structures are associated with a plurality of different rewriteable labels and configured to individually form sealed enclosures between the plurality of different rewriteable labels and a housing of the laser printhead assembly.

19. The label modification system of claim 13, wherein the laser containment door includes a camera for use by the placement device to align the opening with the label support fitting.

* * * * *